(12) United States Patent
Kosugi et al.

(10) Patent No.: US 9,484,116 B1
(45) Date of Patent: Nov. 1, 2016

(54) TEST SYSTEM

(71) Applicant: ADVANTEST CORPORATION, Nerima-ku, Tokyo (JP)

(72) Inventors: Masaaki Kosugi, Tokyo (JP); Takashi Ohguro, Tokyo (JP); Michisuke Sakamoto, Tokyo (JP); Toshiro Fujii, Tokyo (JP); Takahiro Honma, Tokyo (JP); Hideto Omori, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/827,743

(22) Filed: Aug. 17, 2015

(51) Int. Cl.
*G01R 31/28* (2006.01)
*G06F 11/00* (2006.01)
*G11C 29/38* (2006.01)
*G11C 29/36* (2006.01)
*G01R 31/319* (2006.01)

(52) U.S. Cl.
CPC ............... *G11C 29/38* (2013.01); *G01R 31/28* (2013.01); *G01R 31/31903* (2013.01); *G11C 29/36* (2013.01)

(58) Field of Classification Search
CPC ............ G01R 31/31903; G01R 31/28; G01R 31/2844; G01R 31/31724; G01R 31/318555; G01R 31/31908; G01R 31/2801; G01R 31/2805; G06F 11/3672; G11C 29/08; G11C 29/38; G11C 29/36

USPC ........ 714/724, 725, 733, 734, 736, 735, 741, 714/31
See application file for complete search history.

(56) References Cited

U.S. PATENT DOCUMENTS

| | | | | |
|---|---|---|---|---|
| 7,559,003 B2* | 7/2009 | Takahashi | .............. | G11C 29/56 714/736 |
| 7,743,304 B2* | 6/2010 | Volkerink | ........ | G01R 31/31903 714/724 |
| 7,849,375 B2* | 12/2010 | Saito | ................... | G06F 11/2733 714/736 |

FOREIGN PATENT DOCUMENTS

| | | |
|---|---|---|
| JP | 2000-306395 A | 11/2000 |
| JP | 2006-114149 A | 4/2006 |
| JP | 2007-080422 A | 3/2007 |
| WO | 2010064312 A1 | 6/2010 |

* cited by examiner

*Primary Examiner* — Christine Tu
(74) *Attorney, Agent, or Firm* — Cantor Colburn LLP

(57) ABSTRACT

At least one general-purpose server is connected to a PE module via Ethernet (trademark). A control unit of the PE module controls a PE circuit and multiple fail memory in a real-time manner, temporarily stores fail information stored in the multiple fail memory, performs data processing on the fail information, and transfers the fail information thus processed to the general-purpose server. Each general-purpose server is controlled according to a computer program so as to perform redundancy analysis for a DUT based on the data received from the PE module.

11 Claims, 5 Drawing Sheets

TEST SYSTEM

BACKGROUND OF THE INVENTION

1. Field of the Invention

The present invention relates to a test apparatus that tests a semiconductor device such as memory or the like.

2. Description of the Related Art

Memory such as DRAM has a problem in that defective memory cells occur with a certain probability. In a case in which, when a part of memory cells are defective, judgment is made that the memory itself is defective, this leads to marked reduction in yield. In order to solve such a problem, such memory is provided with a redundancy circuit that can be used as a backup for such defective cells. A test apparatus tests memory so as to generate a quality judgment result (fail information) with respect to the memory cell arrays, and stores the quality judgment result thus generated in fail memory. The test apparatus acquires a redundancy repair state based on the fail information. Subsequently, laser repair is performed according to the redundancy repair state thus acquired.

FIG. 1 is a block diagram showing a test system including a test apparatus 500 investigated by the present inventors. The test system 600 includes the test apparatus 500 that tests a DUT 602, an EWS (Engineering Workstation) 604, and a network hub 606.

The EWS 604 executes a test program so as to integrally control the overall operation of the test apparatus 500. The EWS 604 acquires and stores various kinds of data such as test results and the like. The EWS 604 is connected to the test apparatus 500 via the hub 606 and a high speed bus such as gigabit Ethernet (trademark) or the like.

The test apparatus 500 tests multiple DUTs (devices under test) 602 at the same time in a parallel manner. Furthermore, the test apparatus 500 performs pass/fail judgment, and performs calculation so as to acquire a redundancy repair state. The test apparatus 500 includes multiple CPU (Central Processing Unit) boards 510 and multiple PE (Pin Electronics) boards 520.

Each PE board 520 is configured to be capable of measuring multiple (e.g., twelve) DUTs 602. Each PE board 520 mounts multiple PE circuits 522, multiple fail memory 524, an MRA interface 526, and a test processor 528. The test processor 528 controls the PE circuits 522 mounted on the same PE board 520. Each PE circuit 522 is assigned to multiple DUTs 602. Each PE circuit 522 generates a test pattern according to the control operation of the test processor 528, and supplies the test pattern thus generated to the DUTs 602. Data that corresponds to the test pattern is written to the DUT 602 configured as memory. Each PE circuit 522 reads out the data written to the corresponding DUT 602, compares the data thus read out with expected value data, and acquires fail information that represents the comparison result. Each PE circuit 522 includes a timing generator, a pattern generator, a waveform shaper, a pattern comparator, and the like, for example. Each PE circuit 522 may be configured as a function LSI integrated on a single semiconductor chip. The fail information generated by each PE circuit 522 is written to the corresponding fail memory 524. Each fail memory 524 includes FAM (Fail Address Map) or FMB (Fail Bit Map).

Each CPU board 510 is configured such that it can be connected to multiple (up to a maximum of eight, for example) PE boards 520. Each CPU board 510 is connected to the PE boards 520 via a high-speed interface having a multi-gigabit data transmission rate. Each CPU board 510 includes multiple RCPUs (Repair CPUs) 512 and a test processor 514.

The CPU board 510 and the PE board 520 are connected to each other via a bus 530 and a pair of transceivers 540A and 540B. The test processor 514 included in the CPU board 510 is connected to the respective test processors 528 of the multiple PE boards 520 via a bus 532. The bus 532 is configured to have a bandwidth on the order of 1 Gbps. Each PE board 520 is controlled via the bus 530 in a real-time manner.

Each RCPU 512 is assigned to multiple (e.g., two) PE boards 520. For example, the first RCPU 512_1 is assigned to the two PE boards 520_1 and 520_2 such that it is assigned to six fail memory 524 mounted on the PE boards 520_1 and 520_2. Each RCPU 512 controls the corresponding six fail memory 524 in a real-time manner. Furthermore, the RCPU 512 receives the fail information from each fail memory 524, and calculates a repair state. The second RCPU 512_2 is assigned to six fail memory 524 mounted on a different pair of PE boards 520. The same can be said of the other RCPUs 512. Specifically, the RCPU 512_1 and the MRA interface 526 are connected to each other via the transceivers 540A and 540B and the bus 534.

Each MRA interface 526 monitors multiple (e.g., three) fail memory 524. When a flag is asserted, which indicates that acquisition of fail information has been completed for a prescribed unit (e.g., for one of the DUTs), the MRA interface 526 transfers the fail information to the corresponding RCPU 512 via the bus 532. The bus 532 is assigned to each fail memory, and is configured to have a bandwidth on the order of 1 Gbps for each fail memory. The RCPU 512 performs Redundancy Analysis calculation (which is also referred to as "RA processing") for calculating a repair state based on the fail information transmitted from the MRA interface 526.

With the test apparatus 500 having such an architecture shown in FIG. 1, each RCPU 512 performs both the control operation (which will also be referred to as the "FM control operation") for each fail memory 524 and the RA processing. The FM control operation must be performed in a real-time manner. That is to say, the RCPU 512 is required to provide a high-speed FM control operation. In contrast, the RA processing requires a long calculation time. With conventional techniques, there is a need to develop such a CPU board 510 so as to satisfy the specifications for both the RA processing and the FM control operation. Furthermore, there is a need to design an interface between the CPU board 510 and the PE board 520 so as to satisfy the requisite performance. With such an example shown in FIG. 1, the data transmission for the test processor side requires a total of 8 Gbps, and the data transmission for the RCPUs 512 side requires a total of 6 Gbps.

As a result obtained by investigating the test apparatus 500 shown in FIG. 1, the present inventor has come to recognize the following problem.

The amount of calculation to be provided by each RCPU changes according to the number of DUTs 602 to be processed. Accordingly, there is a need to design the RCPU 512 to have a calculation processing capacity such that the RA processing can be completed within a realistic period of time even in a case in which the RCPU 512 has the greatest load concentration (i.e., in a case in which the number of DUTs is large). This can lead to increased costs for such a CPU. In addition, the RCPU 512 thus designed has an obviously unnecessarily high calculation processing capacity in a case in which the RCPU 512 operates in a light load state (in a case in which the number of DUTs is small).

Furthermore, the interface between the CPU board 510 and the PE board 520 is required to have a bandwidth of several Gbps. Thus, there is a need to employ the transceivers 540A and 540B and the bus 530 designed as a dedicated interface so as to satisfy the specifications. However, improvement occurs in the performance of DUTs every two to three years. This involves an increase in the amount of fail information data. Accordingly, this requires a great design change of the interface between the CPU board 510 and the PE board 520. This often leads to a problem of an increased development period and a problem of increased costs.

The CPUs that can be employed in the development of a new-generation test apparatus are not always configured to have the same architectures as those of CPUs employed in a previous-generation test apparatus. In some cases, the new-generation CPUs have poor compatibility. In this case, evaluation of CPU compatibility requires enormous effort.

If the development of the CPU board 510 takes a long period of time, this leads to a long time lag between the design start time point and the product release time point. Typically, the circuit elements such as CPUs are selected based on the design specifications defined at the design start time point. Accordingly, the CPUs thus selected at the design start time point will become one generation behind at the product release time. Thus, such CPUs can become a bottleneck.

In recent years, as semiconductor devices are improved to have an increased operating speed and an increased capacity, an amount of data to be processed by the test apparatus 500 has been steadily increasing. Accordingly, in a case in which the test apparatus 500 having a conventional architecture is configured to support a semiconductor device configured according to a leading-edge technique, such an arrangement leads to a problem of very high costs.

SUMMARY OF THE INVENTION

An embodiment of the present invention has been made in order to solve such a problem. Accordingly, it is an exemplary purpose of the present invention to provide a test system having a simple architecture that supports semiconductor devices configured according to leading-edge techniques and/or a test system that is capable of suppressing an increase in costs.

With a test system according to an embodiment of the present invention, which is required to perform a control operation (FM control operation) for fail memory in a real-time manner, such an FM control operation is performed by a control unit provided in the vicinity of a pin electronics module side that corresponds to the fail memory. On the other hand, redundancy analysis (RA) processing is performed by a general-purpose server based on the fail information after the fail information is transferred to the general-purpose server. The pin electronics module and the general-purpose server are connected to each other via Ethernet, which requires no dedicated driver or the like.

More specifically, a test system according to an embodiment of the present invention comprises: a pin electronics module; and at least one general-purpose server each connected to the pin electronics module via Ethernet (trademark). The pin electronics module comprises: a pin electronics circuit that acquires fail information with respect to a device under test; multiple fail memory that store the fail information; and a control unit that controls the pin electronics circuit and the multiple fail memory in a real-time manner, that temporarily holds the fail information with respect to the multiple fail memory, that performs data processing on the fail information, and that transfers the fail information thus processed to the general-purpose server. The general-purpose server is controlled according to a computer program so as to perform redundancy analysis for the device under test based on the data received from the pin electronics module.

The general-purpose server is provided with Ethernet as standard equipment. By employing Ethernet as an interface with the pin electronics module, in a case in which specifications are modified with respect to one from among the general-purpose server and the pin electronics module, such an arrangement allows the interface to be used as it is without change. That is to say, in this case, there is no need to redesign the interface. Also, by controlling the general-purpose server in a software manner, such an arrangement allows the calculation load to be distributed among multiple general-purpose servers or among multiple CPUs. Accordingly, such an arrangement allows the calculation capacity required for each CPU to be reduced, as compared with conventional RCPUs. Thus, with such an embodiment, such a general-purpose server can be provided with reduced costs.

Also, the control unit may comprise: memory that temporarily stores the fail information; and a first processor that processes the fail information stored in the memory, and supplies the fail information thus processed to the general-purpose server via Ethernet.

Also, the control unit may further comprise a second processor that transfers the fail information from the multiple fail memory to the memory.

Also, the second processor may comprise a programmable logic device. For example, the programmable logic device may be configured as an FPGA (Field Programmable Gate Array).

Also, the test system according to an embodiment may be configured to allow the number of general-purpose servers to be changed according to a scale of the pin electronics module. With such an arrangement employing Ethernet, by employing a bus switch, such an arrangement allows the number of general-purpose servers to be changed in a simple manner.

Also, at least one general-purpose server may each comprise multiple cores. Also, the multiple cores may be dynamically assigned to the multiple fail memory. By dynamically assigning the multiple cores to the multiple fail memory, such an arrangement allows the load to be appropriately distributed among the multiple cores.

At least one or more general-purpose servers may each include multiple cores. After one core has completed a given operation, said one core may take over a part of the processing assigned to a different core. Such an arrangement is capable of reducing the RA processing time.

Also, at least one general-purpose server may each comprise multiple resources. While a resource analyzes one fail pattern by means of one algorithm, another vacant resource analyzes said one fail pattern by means of another algorithm in parallel.

Here, the resource represents a unit configured to perform task processing. Specifically, the resource may be configured as a CPU or otherwise a core. Such an arrangement allows the RA processing time to be shorten.

Another embodiment of the present invention also relates to a test system. The test system comprises: a pin electronics module; and at least one blade server each connected to the pin electronics module via Ethernet (trademark). The pin electronics module is configured as a hardware device so as to have: (i) a function of acquiring fail information with respect to a device under test; (ii) a function of controlling acquisition of the fail information in a real-time manner; and (iii) a function of transferring the fail information to the blade server. The blade server is controlled according to a computer program so as to perform redundancy analysis for the device under test based on the data received from the pin electronics module.

Yet another embodiment of the present invention relates to a test apparatus. The test apparatus is used in a state in which the test apparatus is connected to at least one general-purpose server via Ethernet (trademark). The test apparatus comprises multiple pin electronics modules. The pin electronics modules each comprises: a pin electronics circuit that acquires fail information with respect to a device under test; multiple fail memory that store the fail information; and a control unit that controls the pin electronics circuit in a real-time manner, that temporarily holds the fail information stored in the multiple fail memory, that performs data processing on the fail information, and that transfers the fail information thus processed to the general-purpose server.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 2:
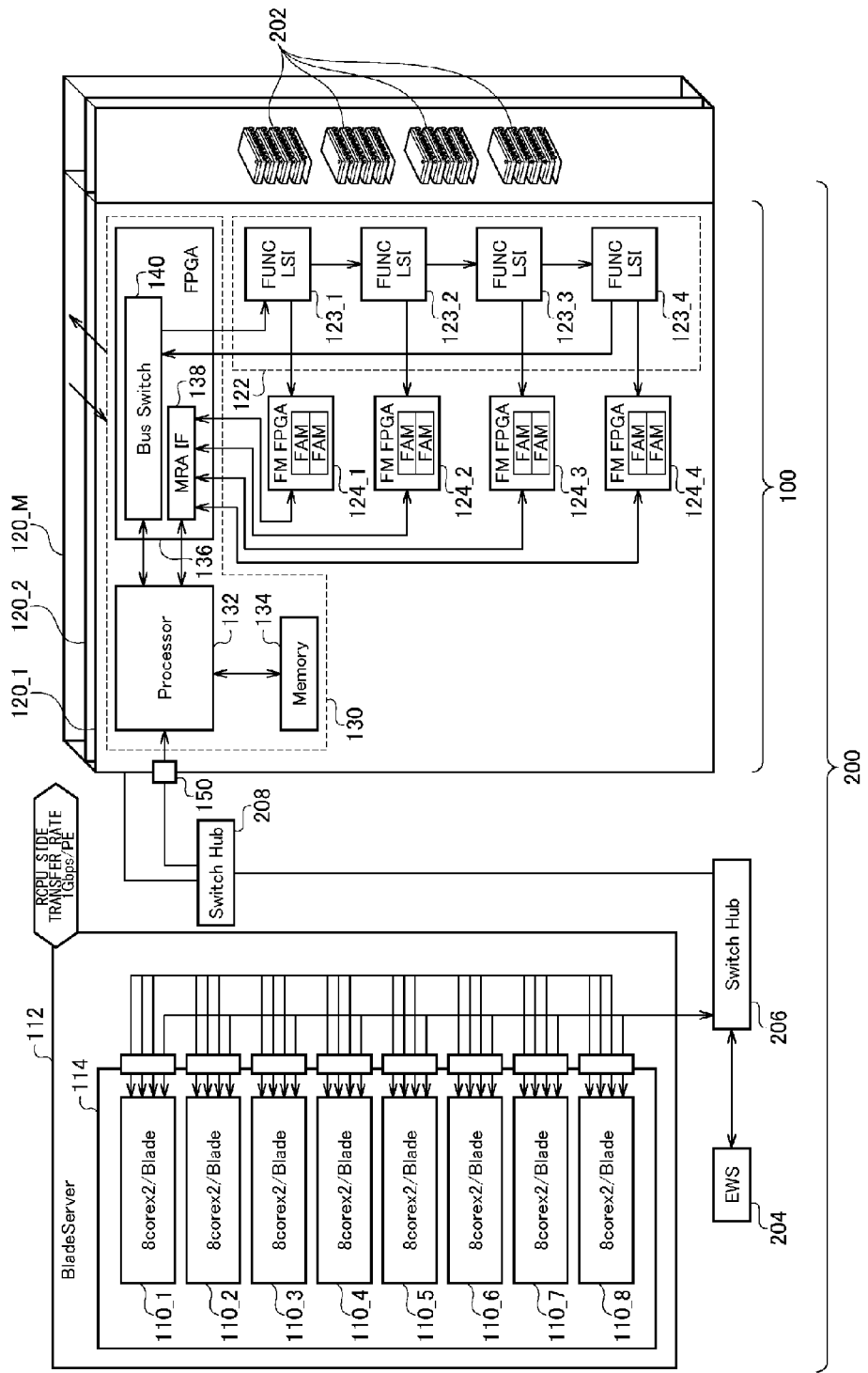
FIG. 2 is a block diagram showing a test system according to an embodiment.

FIG. 2 is a block diagram showing a test system 200 according to an embodiment. The test system 200 includes a test apparatus 100, one or more general-purpose servers 110, an EWS 204, and hubs 206 and 208.

The test apparatus 100 includes a quantity M (e.g., 24) of PE modules 120. The test apparatus 100 is connected to the EWS 204 and a blade server 112 via the network hubs 206 and 208. Each PE module 120 is configured as a hardware component to have: (i) a function of acquiring the fail information with respect to the DUT 202; (ii) a function of controlling the acquisition of the fail information in a real-time manner; and (iii) a function of transferring the fail information to the general-purpose server (blade server) 110. On the other hand, the general-purpose server (blade server) 110 is controlled according to a computer program so as to perform redundancy analysis for the DUT 202 based on the data received from the PE module 120.

At least one or more (a quantity N) general-purpose servers 110 are connected to a quantity (M) of PE modules 120 via Ethernet. FIG. 2 shows an arrangement including eight (N=8) general-purpose servers 110_1 through 110_8. Preferably, the general-purpose servers 110_1 through 110_8 are each configured as a rack-mount server. More preferably, each general-purpose server 110 is configured as a blade server. The blade server 112 includes: a rack (housing) 114 that can mount the general-purpose server 110 which is referred to as a "blade", an unshown power supply, an unshown fan, and the like. Such a general-purpose server 110 will also be referred to as a "blade" hereafter. Each blade 110 includes one or multiple CPUs each of which may be configured as a multi-core CPU. For example, each blade 110 may include a pair of 8-core CPUs. In this case, the blade server 112 mounts 16 (=8×2) CPUs. Thus, the blade server 112 includes (16×8) cores.

It should be noted that the general-purpose server 110 is not restricted to such a blade server. The interface provided to the test apparatus 100 is configured as Ethernet, which requires no dedicated driver. Thus, the general-purpose server 110 may be configured as a CPU having an Ethernet function. For example, an EWS may be employed as the general-purpose server 110. In a case in which such a test system 200 is newly constructed, the test system 200 employing such blade servers has advantages from the viewpoint of costs and the viewpoint of size. However, if the user already possesses EWSs or the like, the user may employ such EWSs or the like, thereby reducing costs.

The PE module 120 includes a PE circuit 122, multiple fail memory 124, a control unit 130, and an Ethernet transceiver 150. The PE module 120 may be configured as a single board.

The PE circuit 122 generates a test pattern, and supplies the test pattern thus generated to the multiple DUTs 202. The data that corresponds to the test pattern is written to each DUT 202 configured as memory. The PE circuit 122 reads out the data written to the DUT 202, compares the data thus read out with expected value data, and acquires the fail information that represents the comparison result. The PE circuit 122 may include multiple function LSIs (Large Scale Integrated circuits) 123_1 through 123_4.

Figure 3:
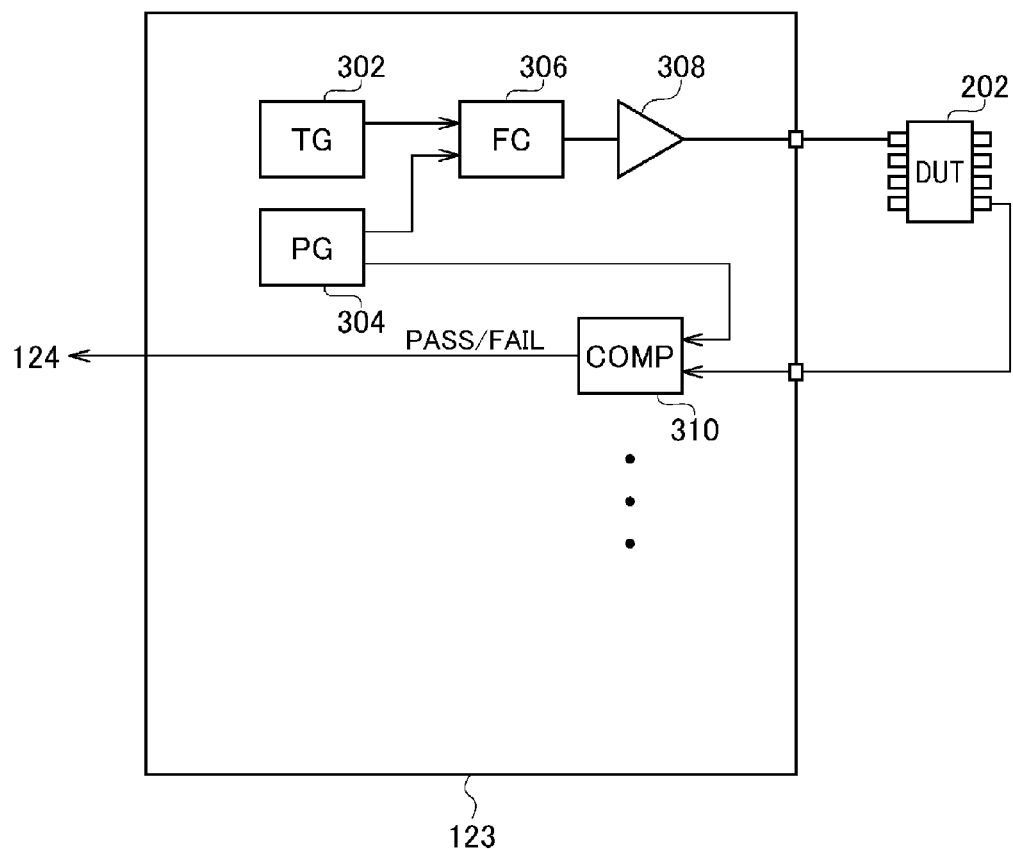
FIG. 3 is a block diagram showing an example configuration of a function LSI.

FIG. 3 is a block diagram showing an example configuration of the function LSI 123. FIG. 3 shows a one-channel configuration. The function LSI 123 includes a timing generator 302, a pattern generator 304, a waveform shaper 306, a driver 308, and a pattern comparator 310, and the like. The timing generator 302 generates timing data that defines a transition timing of the test pattern to be supplied to the DUT 202. The pattern generator 304 generates a test pattern. The waveform shaper 306 generates a test signal having an adjusted waveform based on the timing data and the test pattern. The driver 308 outputs the test signal to the DUT 202. With such an arrangement, predetermined data is written to a predetermined address on the DUT 202. The pattern comparator 310 compares the data read out from the DUT 202 with the corresponding expected value. The comparison result (Pass/Fail) obtained for each address is written to the fail memory 124.

Returning to FIG. 2, the function LSIs 123_1 through 123_4 are connected to the control unit 130 in a daisy-chain connection manner so as to allow the control unit 130 to control the function LSIs 123. It should be noted that the connection manner with which the function ICs 123 are connected to the control unit 130 is not restricted to such a daisy-chain connection. Examples of such connections that can be employed include bus connection, star connection, etc.

The fail information with respect to each DUT 202 generated by the PE circuit 122 is written to the corresponding fail memory 124. The fail memory 124 includes a FAM (Fail Address Map) or FBM (Fail Bit Map), and is configured as a programmable device such as an FPGA or the like. In the present embodiment, the fail memory 124 is provided to each LSI 123. In the present embodiment, each fail memory 124 is configured as dual-channel memory to be pipeline controlled. Specifically, in the foreground operation, a device test is performed according to the control operation of the test processor 528. Furthermore, the data generated by the PE circuit 522 is written to one channel of the fail memory 124. In the background operation, the MRA interface 526 is capable of reading out the data written to the other channel of the fail memory 124. Such an arrangement resolves a so-called overhead problem.

The control unit 130 controls the PE circuit 122 in a real-time manner. Furthermore, the control unit 130 temporarily holds the fail information stored in the multiple fail memory 124_1 through 124_4. After the data processing is performed, the control unit 130 transfers the fail information thus held to the general-purpose server 110. The destination general-purpose server 110 is selected according to the request transmitted from the blade server 122 side. Also, the control unit 130 may select one such general-purpose server 110 as a fail information destination based on the vacancy information with respect to the multiple general-purpose servers 110.

The control unit 130 includes a first processor 132, memory 134, and a second processor 136. The memory 134 temporarily stores the fail information that is stored in the fail memory 124 in units of DUTs. The first processor 132 processes the fail information stored in the memory 134, and transfers the fail information thus processed to the general-purpose server 110 via Ethernet. The second processor 136 reads out the fail information stored in the fail memory 124_1 through 124_4, and transfers the fail information thus read out to the memory 134.

Furthermore, the first processor 132 controls the second processor 136 according to a control instruction received from the blade server 112, so as to control the PE circuit 122 in a real-time manner. The second processor 136 controls the multiple function LSIs 123 using a bus control method according to a control instruction received from the first processor 132. The first processor 132 is connected to a different PE module 120 via a backboard, which allows the first processor 132 to control a hardware resource mounted on the different PE module 120.

The second processor 136 mainly includes two function blocks, i.e., an MRA interface 138 and a bus switch 140, and is preferably configured as a programmable logic device such as an FPGA or the like. The bus switch 140 switches connections between the first processor 132, multiple function LSIs 123_1 through 123_4, unshown registers, an unshown internal bus, and unshown memory. The bus control operation may be performed using known techniques. That is to say, the method for performing the bus control operation is not restricted in particular.

The MRA interface 138 monitors the multiple fail memory 124_1 through 124_4. After the acquisition of the fail information for a prescribed unit (e.g., for one of the DUTs), the fail memory 124 turns on a flag (asserts a flag) that represents the completion of fail information acquisition. When the fail memory 124 asserts this flag, the fail information is transferred from the fail memory 124 to the memory 134 in a DMA (Direct Memory Access) manner.

Description will be made regarding the transfer of the fail information from the control unit 130 to the general-purpose server 110.

The first processor 132 transfers the fail information stored in the memory 134 and its accompanying data to the general-purpose server 110. With the Ethernet configured as an interface between the first processor 132 and the general-purpose server 110, in a case in which data transmission is performed in units of amounts of data on the order of several MB (megabytes), such an arrangement provides its rated performance (data transmission rate on the order of 1 Gbps). However, the fail information to be written to the fail memory 124 in a real-time manner has an amount of data of several words. Accordingly, in a case in which the fail information written to the fail memory 124 for every DUT is transferred to the general-purpose server 110 in a real-time manner, such an arrangement leads to degradation in the Ethernet transmission rate. In some cases, this leads to insufficient Ethernet data transmission performance.

In order to solve such a problem, the first processor 132 processes the fail information stored in the memory 134 into data that can be transferred with a high data transmission rate via Ethernet. Specifically, instead of transferring the fail information in minimum units in a real-time manner, the first processor 132 bundles the fail information every time a predetermined amount of data of the fail information is stored, and transmits the fail information thus bundled to the general-purpose server 110. In this step, redundant data may be eliminated from the fail information thus bundled as a single data unit, thereby reducing the overhead. Such an arrangement is capable of transferring the fail information generated for each of an enormous number of DUTs 202 in a real-time manner to the general-purpose server 110 via Ethernet.

It should be noted that each processed data may comprise multiple fail information obtained from a single fail memory 124 only. Alternatively, each processed data may comprise multiple fail information obtained from multiple different fail memory 124.

Figure 4A:
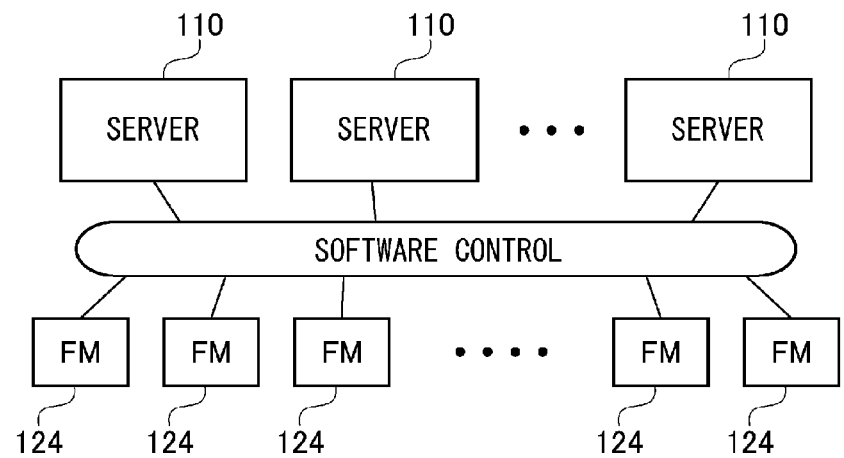
FIGS. 4A through 4C are schematic diagrams each showing RA processing provided by a general-purpose server.
Figure 4B:
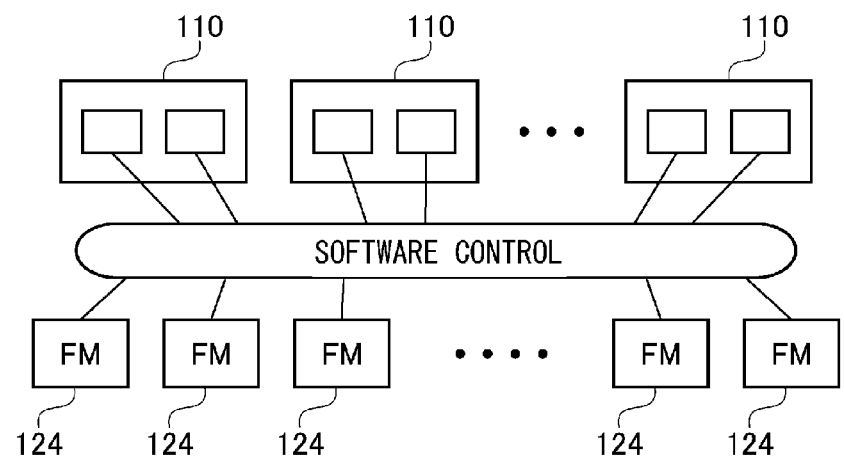
Figure 4C:
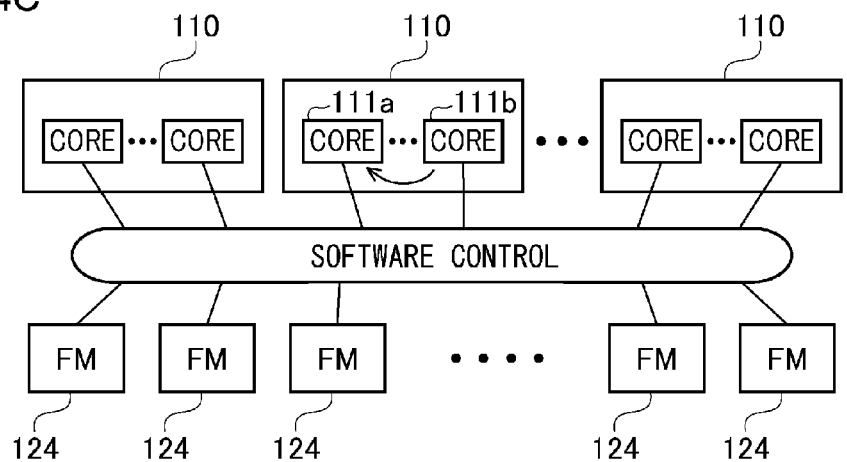

The general-purpose server 110 is controlled according to a computer program so as to perform redundancy analysis for the DUT 202 based on the data including the fail information received from the PE module 120. FIGS. 4A through 4C are diagrams each showing a schematic configuration of the RA processing provided by the general-purpose server 110.

As described above, the blade server 112 may include multiple general-purpose servers 110. With such an arrangement, as shown in FIG. 4A, the blade server 112 may be controlled according to a computer program such that the multiple general-purpose servers 110 are dynamically assigned to the multiple fail memory 124. That is to say, instead of fixing the correspondence between the general-purpose servers 110 and the fail memory 124, the RA processing to be newly performed is preferentially assigned to a vacant general-purpose server. Thus, such an arrangement is capable of preventing load concentration from occurring in any particular general-purpose server 110. This allows the performance required for such a general-purpose server 110 to be reduced.

Also, each general-purpose server 110 may include multiple CPUs. With such an arrangement, as shown in FIG. 4B, the blade server 112 may be controlled according to a computer program such that the multiple CPUs are dynamically assigned to the multiple fail memory 124. Such an arrangement allows the RA processing to be performed with higher efficiency.

Also, each general-purpose server 110 may include multiple cores. With such an arrangement, the general-purpose server 110 is preferably designed such that the multiple cores can be dynamically assigned to the multiple fail memory 124. Such an arrangement allows the RA processing to be performed with higher efficiency.

As shown in FIG. 4C, software design may be performed such that, after a first core 111a has completed a part of given processing, the first core 111a is capable of taking over a part of processing assigned to a different core, i.e., a second core 111b. For example, let us consider an arrangement in which the RA processing for the multiple DUTs assigned to given fail memory 124 is assigned to the second core 111b. In a case in which the RA processing for each DUT is designed as a single task, such an arrangement is capable of transferring a part of the RA processing, which has been assigned to the second core 111b for the multiple DUTs, to the first core 111a. That is to say, the multiple cores 111 are controlled according to a computer program such that tasks can be assigned in a flexible manner. Also, software design may be performed such that the RA processing for each bank is configured as a single task. The task takeover may be allowed only among cores included in the same CPU. Also, the task takeover may be allowed only among the cores included within the same general-purpose server 110. Also, the task takeover may be allowed among the multiple general-purpose servers 110.

There are multiple known analysis algorithms for the RA processing. The efficiency of a given analysis algorithm changes according to the fail pattern. For example, a particular analysis algorithm exhibits high efficiency for a fail pattern A. In contrast, a different particular analysis algorithm exhibits high efficiency for a different fail pattern B. In an ordinary operation, a universal algorithm suitable for many fail patterns is selected. However, even in this case, such a universal algorithm exhibits poor efficiency for a particular fail pattern. In order to solve such a problem, in the analyzing step in which a given resource (CPU or core) analyzes the fail pattern using a given analysis algorithm, the same fail pattern may be assigned to a different vacant resource. That is to say, the RA analysis may be simultaneously performed in a parallel manner using different analysis algorithms. Such an arrangement allows the analysis time to be further reduced.

The above is the configuration and the operation of the test system 200.

Figure 1:
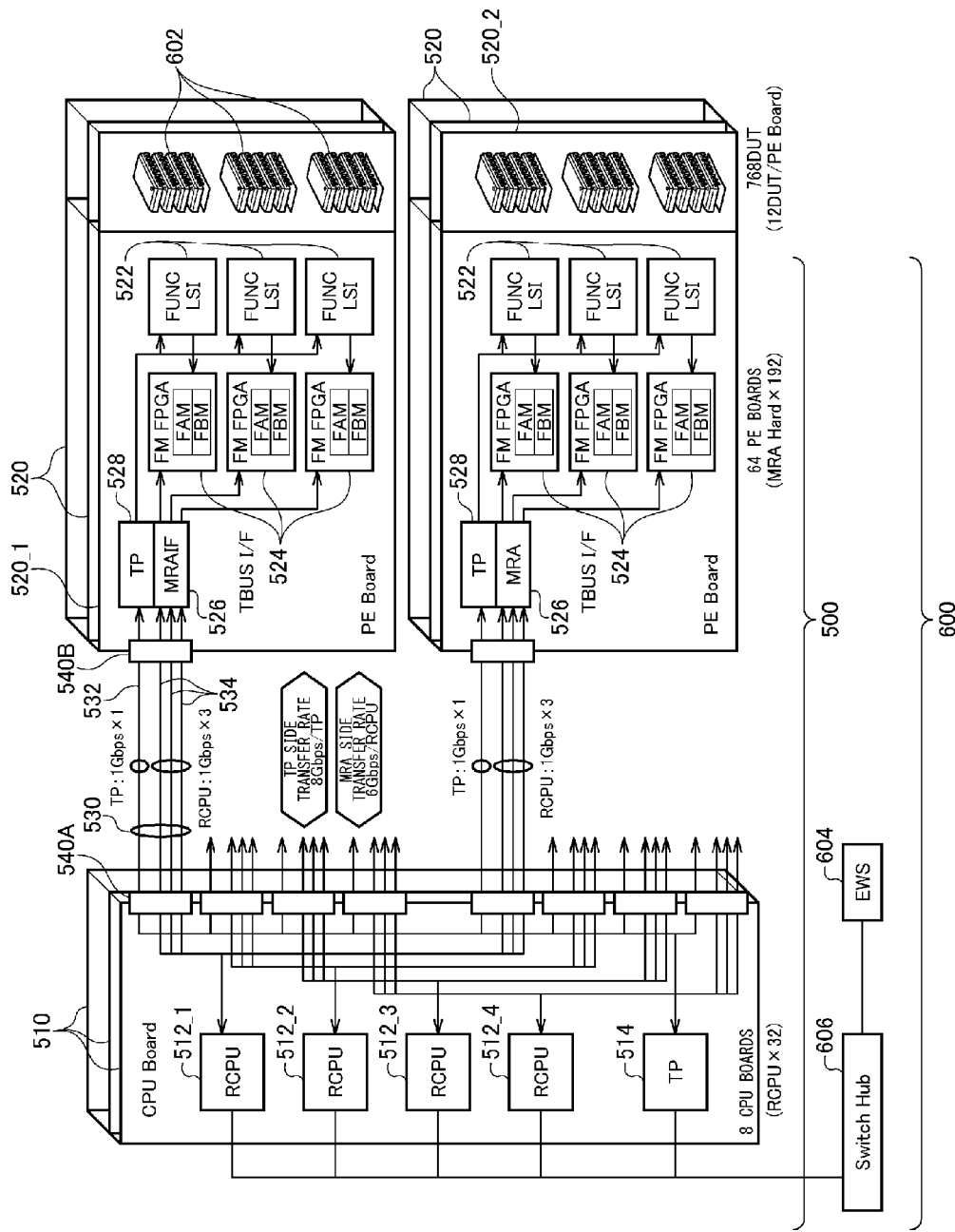
FIG. 1 is a block diagram showing a test system including a test apparatus investigated by the present inventors.
Figure 5:
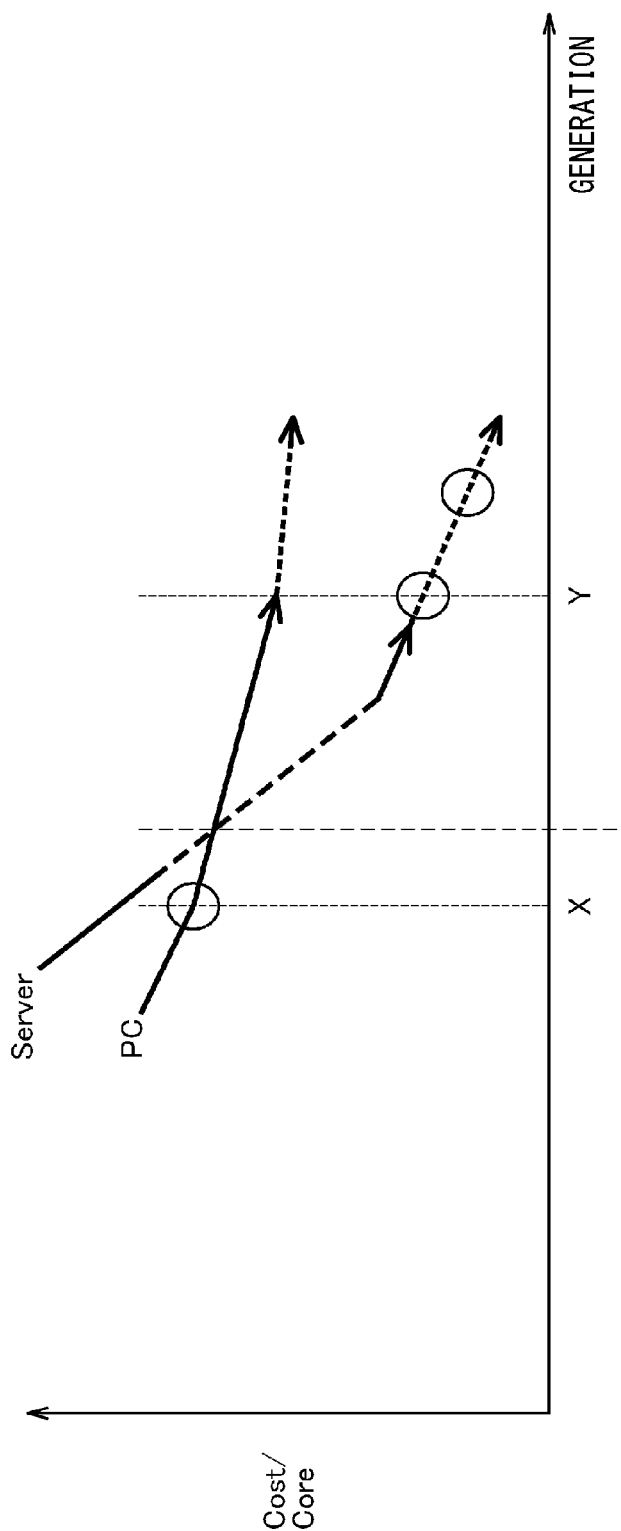
FIG. 5 is a schematic diagram showing the cost per core included in a PC-CPU and the cost per core included in a general-purpose server.

Evaluation will be made below regarding the cost of the test system 200. FIG. 5 is a schematic diagram showing the cost per core included in a PC-CPU and the cost per core included in a general-purpose server. The horizontal axis represents the generation of the tester or otherwise the time axis. It is true that, for a past generation X, PC-CPUs exhibit higher cost performance. Thus, the architecture shown in FIG. 1 exhibits optimum performance. However, in recent years, development has been performed for PC-CPUs focusing on reduction in power consumption, GPU (Graphics Processing Unit) integration, etc. That is to say, it cannot be said that development is being advanced for such PC-CPUs such that they become suitable for RA analysis. In contrast, as the number of cores included in a CPU mounted on a general-purpose server becomes greater, the performance of the server-CPU becomes markedly higher. In particular, in a case in which the number of cores per CPU exceeds six, such a server-CPU exhibits markedly improved cost performance. Accordingly, for the next generation Y and subsequent generations, the architecture shown in FIG. 2 is preferably employed using server-CPUs, thereby suppressing an increase in costs.

The test system 200 is configured to allow the number of general-purpose servers 110 to be changed according to the scale of the PE module 120. That is to say, in a case in which the number of DUTs 202 that are to be simultaneously measured by each PE module 120 is small, or in a case in which the number M of PE modules 120 is small, such an arrangement allows the number of general-purpose servers 110 to be reduced. Conversely, in a case in which the number of DUTs 202 that are to be simultaneously measured by each PE module 120 is large, or in a case in which the number M of PE modules 120 is large, such an arrangement allows the number of general-purpose servers 110 to be increased. That is to say, such an arrangement requires only minimal hardware resources to provide any given system.

Also, the test system 200 allows the number of general-purpose servers 110 to be changed regardless of the scale of the PE module 120. That is to say, the test system 200 allows the user to determine the processing capacity of the blade server 112 side giving consideration to the allowed test time, which is another advantage.

Such a DUT 202 is developed in cycles of two to three years. Accordingly, the test system 200 must be developed following this cycle. With the architecture shown in FIG. 2, Ethernet is employed as an interface between each general-purpose server 110 and the test apparatus 100. Such an arrangement allows an existing general-purpose server 110 to be replaced by a different higher-performance general-purpose server 110 in a simple manner. In some cases, such an arrangement requires new development of the software component. In contrast, the hardware component has high compatibility. Thus, such an arrangement allows the costs required for the compatibility evaluation to be dramatically reduced, as compared with the architecture shown in FIG. 1.

While the preferred embodiments of the present invention have been described using specific terms, such description is for illustrative purposes only, and it is to be understood that changes and variations may be made without departing from the spirit or scope of the appended claims.

What is claimed is:

1. A test system comprising:
   a pin electronics module; and
   at least one general-purpose server each connected to the pin electronics module via Ethernet,
   wherein the pin electronics module comprises:
      a pin electronics circuit that acquires fail information with respect to a device under test;
      a plurality of fail memories that store the fail information; and
      a control unit that controls the pin electronics circuit and the plurality of fail memories in a real-time manner, that temporarily holds the fail information with respect to the plurality of fail memories, that performs data processing on the fail information, and that transfers the processed fail information to the general-purpose server,
   and wherein the general-purpose server is controlled according to a computer program so as to perform redundancy analysis for the device under test based on the processed fail information received from the pin electronics module.

2. The test system according to claim 1, wherein the general-purpose server is configured as a blade server.

3. The test system according to claim 1, wherein the control unit comprises:
   a memory that temporarily stores the fail information; and
   a first processor that processes the fail information stored in the memory, and supplies the processed fail information to the general-purpose server via Ethernet.

4. The test system according to claim 3, wherein the control unit further comprises a second processor that transfers the fail information from the plurality of fail memories to the memory.

5. The test system according to claim 4, wherein the second processor comprises a programmable logic device.

6. The test system according to claim 1, configured to allow the number of general-purpose servers to be changed according to a scale of the pin electronics module.

7. The test system according to claim 1, wherein the at least one general-purpose server each comprise a plurality of cores,
   and wherein the plurality of cores are dynamically assigned to the plurality of fail memories.

8. The test system according to claim 1, wherein the at least one general-purpose server each comprise a plurality of cores,
   and wherein after one of the plurality of cores has completed a given operation, said one of the plurality of cores takes over a part of the processing assigned to a different core.

9. The test system according to claim 1, wherein the at least one general-purpose server each comprise a plurality of resources of the plurality resources,
   and wherein while a resource of the plurality resources analyzes one fail pattern by means of one algorithm, another vacant resource analyzes said one fail pattern by means of another algorithm in parallel.

10. A test system comprising:
    a pin electronics module; and
    at least one blade server each connected to the pin electronics module via Ethernet, wherein the pin electronics module is configured as a hardware device so as to have:
    (i) a function of acquiring fail information with respect to a device under test;
    (ii) a function of controlling acquisition of the fail information in a real-time manner; and
    (iii) a function of transferring the fail information to the blade server,
    and wherein the blade server is controlled according to a computer program so as to perform redundancy analysis for the device under test based on the processed fail information received from the pin electronics module.

11. A test apparatus, wherein the test apparatus is connected to at least one general-purpose server via Ethernet in use, and the test apparatus comprises a plurality of pin electronics modules, wherein the pin electronics modules each comprise:
    a pin electronics circuit that acquires fail information with respect to a device under test;
    a plurality of fail memories that store the fail information; and
    a control unit that controls the pin electronics circuit in a real-time manner, that temporarily holds the fail information stored in the plurality of fail memories, that performs data processing on the fail information, and that transfers the processed fail information to the general-purpose server.

\* \* \* \* \*